(12) United States Patent
Park et al.

(10) Patent No.: US 9,540,723 B2
(45) Date of Patent: Jan. 10, 2017

(54) COLOR FILTER SUBSTRATE, A METHOD OF FABRICATING THE SAME, A DISPLAY DEVICE INCLUDING THE SAME, AND METHOD OF FABRICATING THE DISPLAY DEVICE

(71) Applicant: Samsung Display Co., Ltd., Yongin (KR)

(72) Inventors: JoonYong Park, Gunpo-si (KR); Kyungseop Kim, Hwaseong-si (KR); ChangOh Jeong, Suwon-si (KR); SangWon Shin, Yongin-si (KR); Dongmin Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 194 days.

(21) Appl. No.: 14/155,951

(22) Filed: Jan. 15, 2014

(65) Prior Publication Data

US 2015/0009461 A1    Jan. 8, 2015

(30) Foreign Application Priority Data

Jul. 5, 2013    (KR) .................. 10-2013-0079224

(51) Int. Cl.
| | |
|---|---|
| *C23C 14/08* | (2006.01) |
| *G02F 1/1335* | (2006.01) |
| *G02B 5/20* | (2006.01) |
| *C23C 28/02* | (2006.01) |
| *G02F 1/1343* | (2006.01) |

(52) U.S. Cl.
CPC ............. *C23C 14/081* (2013.01); *C23C 14/08* (2013.01); *G02B 5/201* (2013.01); *G02F 1/133514* (2013.01); *G02F 1/133516* (2013.01); *C23C 28/028* (2013.01); *G02F 1/13439* (2013.01); *G02F 2201/121* (2013.01)

(58) Field of Classification Search
CPC ................... G02F 1/133514; G02F 1/133516; G02F 2001/133519; G02F 1/13439; G02F 2001/1555; G02F 2201/121; C23C 14/08; C23C 14/081; C23C 14/086; C23C 16/40; C23C 16/403; C23C 16/407; C23C 28/028

See application file for complete search history.

(56) References Cited

U.S. PATENT DOCUMENTS

| | | | |
|---|---|---|---|
| 6,608,660 B1 | 8/2003 | Okamoto et al. | |
| 8,009,253 B2 | 8/2011 | Harada | |

(Continued)

FOREIGN PATENT DOCUMENTS

| | | |
|---|---|---|
| JP | 2001-021879 | 1/2001 |
| JP | 2004-333666 | 11/2004 |

(Continued)

*Primary Examiner* — Paisley L Arendt
(74) *Attorney, Agent, or Firm* — H.C. Park & Associates, PLC

(57) ABSTRACT

A color filter substrate including a base substrate, a color layer on the base substrate, a conductive layer on the color layer, and a grain compensation layer between the color layer and the conductive layer. The grain compensation layer includes zinc oxide and a metal oxide other than zinc oxide. A content of the metal oxide is lower than that of the zinc oxide in the grain compensation layer. The grain compensation layer increases the grain size of the conductive layer.

20 Claims, 9 Drawing Sheets

(56) References Cited

U.S. PATENT DOCUMENTS

| | | | |
|---|---|---|---|
| 8,264,644 B2 | 9/2012 | Seo et al. | |
| 2007/0046184 A1 | 3/2007 | Chiang et al. | |
| 2007/0169805 A1* | 7/2007 | Sasaki | H01L 31/02246 |
| | | | 136/256 |
| 2008/0230123 A1 | 9/2008 | Mitsui et al. | |
| 2009/0242887 A1* | 10/2009 | Yamamoto | C23C 14/086 |
| | | | 257/59 |

FOREIGN PATENT DOCUMENTS

| | | |
|---|---|---|
| JP | 2009-098567 | 5/2009 |
| JP | 2010-175918 | 8/2010 |
| KR | 10-0325119 | 6/2002 |
| KR | 10-1208380 | 12/2012 |

* cited by examiner

COLOR FILTER SUBSTRATE, A METHOD OF FABRICATING THE SAME, A DISPLAY DEVICE INCLUDING THE SAME, AND METHOD OF FABRICATING THE DISPLAY DEVICE

CROSS-REFERENCE TO RELATED APPLICATION

This U.S. non-provisional patent application claims priority from and the benefit of Korean Patent Application No. 10-2013-0079224, filed on Jul. 5, 2013, which is hereby incorporated by reference for all purposes as if fully set forth herein.

BACKGROUND

Field

Exemplary embodiments of the present invention relate to a color filter substrate, a method of fabricating the same, a display device including the same, and a method of fabricating the display device and, more particularly, to a color filter substrate capable of preventing a border stain, a method of fabricating the same, a display device including the same, and a method of fabricating the display device.

Discussion of the Background

Display devices include organic light emitting display devices, liquid crystal display device, plasma display devices, and electrophoretic display devices. The liquid crystal display device has relatively low power consumption, excellent portability, and high value.

Generally, the liquid crystal display device includes an array substrate, a color filter substrate opposite the array substrate, and a liquid crystal layer disposed therebetween. The liquid crystal display device displays an image by application of an electric field to the liquid crystal layer.

The color filter substrate includes a color layer having red, green, and blue colors, and a common electrode layer for generating the electric field in the liquid crystal layer. Light transmitted through the color filter substrate may therefore exhibit various colors.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide a color filter substrate that is capable of increasing a grain size of a common electrode layer and is capable of preventing the occurrence of a border stain, and also provide a display device including the same.

Exemplary embodiments of the present invention also provide a method of fabricating the color filter substrate and a method of fabricating the display device.

Additional features of the invention will be set forth in the description which follows, and in part will be apparent from the description, or may be learned by practice of the invention.

An exemplary embodiment of the present invention discloses a color filter substrate including a base substrate, a color layer disposed on the base substrate, a conductive layer disposed on the color layer, and a grain compensation layer. The grain compensation layer includes zinc oxide (ZnO) and a first metal oxide different from the zinc oxide. A content of the first metal oxide is lower than that of the zinc oxide in the grain compensation layer. The grain compensation layer is disposed between the color layer and the conductive layer to increase a grain size of the conductive layer.

An exemplary embodiment of the present invention also discloses a display device including a color filter substrate, an array substrate opposing the color filter substrate and including driving elements, and a liquid crystal layer sealed between the color filter substrate and the array substrate. An electric field corresponding to each of pixels is generated in the liquid crystal layer. The color filter substrate includes a base substrate, a color layer disposed on the base substrate, an insulating layer disposed on the color layer, a conductive layer disposed on the color layer; and a grain compensation layer disposed between the insulating layer and the conductive layer. The grain compensation layer may include zinc oxide (ZnO) and a first metal oxide different from the zinc oxide. A content of the metal oxide is lower than that of the zinc oxide in the grain compensation layer, and the grain compensation layer increases a grain size of the conductive layer.

An exemplary embodiment of the present invention also discloses a method of fabricating a color filter substrate including forming a color layer on a base substrate, forming a grain compensation layer on the color layer, and forming a conductive layer on the grain compensation layer. The grain compensation layer may include zinc oxide (ZnO) and a first metal oxide different from the zinc oxide. A content of the metal oxide is lower than that of the zinc oxide in the grain compensation layer and the grain compensation layer increases a grain size of the conductive layer.

An exemplary embodiment of the present invention also discloses a method of fabricating a display device including forming driving elements on an array substrate, forming a color filter substrate, bonding the color filter substrate to the array substrate, and injecting a liquid crystal between the color filter substrate and the array substrate to form a liquid crystal layer. Forming the color filter substrate includes forming a color layer including at least one color filter and a black matrix adjacent to the at least one color filter on a base substrate, forming a grain compensation layer on the color layer, and forming a conductive layer on the grain compensation layer. The grain compensation layer includes zinc oxide (ZnO) and a first metal oxide different from the zinc oxide. A content of the metal oxide is lower than that of the zinc oxide in the grain compensation layer. The grain compensation layer increases a grain size of the conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
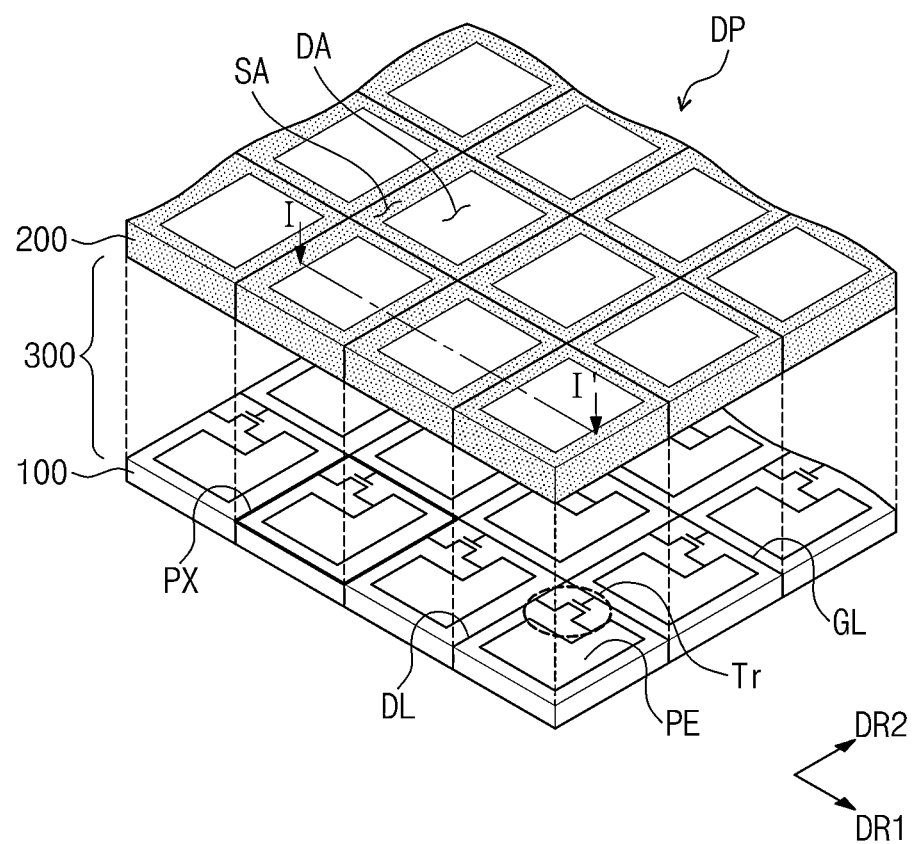
FIG. 1 is a perspective view illustrating a region of a display device according to an exemplary embodiment of the present invention

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements. The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element or layer is referred to as being "on"; "connected to"; or "coupled to" another element or layer, it can be directly on; directly connected to; or directly coupled to the other element or layer, or intervening elements or layers may be present. In contrast, when an element or layer is referred to as being "directly on"; "directly connected to"; or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are described with sectional views as exemplary views of the present invention. Accordingly, shapes of the exemplary views may be modified according to manufacturing techniques and/or allowable errors. Therefore, the exemplary embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the present invention.

It will be also understood that although the terms first, second, third etc. may be used herein to describe various elements, these elements should not be limited by these terms. These terms are only used to distinguish one element from another element. Thus, a first element in some exemplary embodiments could be termed a second element in other exemplary embodiments without departing from the teachings of the present invention. Exemplary embodiments of the present inventive concepts explained and illustrated herein include their complementary counterparts.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Figure 2:
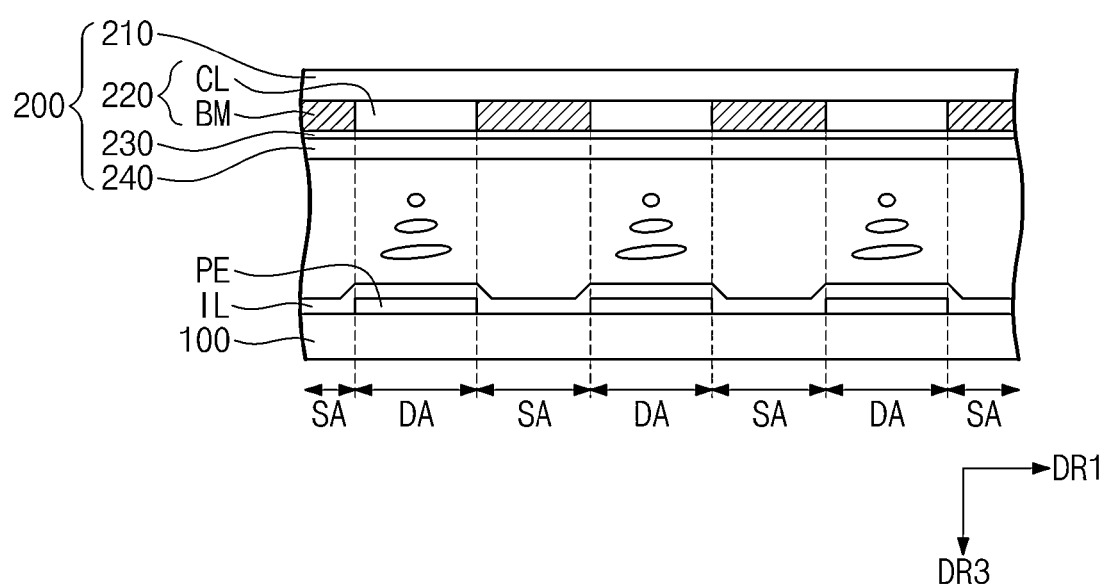
FIG. 2 is a cross-sectional view taken along a line I-I' of FIG. 1.

As illustrated in FIGS. 1 and 2, a display device DP includes a lower substrate 100, a color filter substrate 200, and a liquid crystal layer 300. The lower substrate 100 may be an array substrate on which a plurality of driving elements and signal interconnections are disposed.

A plurality of pixels PX are connected to the signal interconnections disposed on the lower substrate 100. The signal interconnections may include data lines DL and gate lines GL.

The data lines DL may be spaced apart from each other in a first direction DR1 and to extend in a second direction DR2 crossing the first direction DR1. The gate lines GL may be spaced apart from each other in the second direction DR2 and extend in the first direction DR1. The data lines DL and the gate lines GL may selectively apply electrical signals to the pixels PX.

Each of the pixels PX includes at least one switching element Tr and a pixel electrode PE. Each of the pixels PX may output data according to the electrical signals. The switching element Tr may include a gate electrode, a source electrode, a drain electrode, a semiconductor active layer, and a gate insulating layer. The gate electrode is electrically connected to the gate line GL. The source electrode is electrically connected to the data line DL.

The pixel electrode PE is electrically connected to the drain electrode. The pixel electrode PE may constitute a capacitor in each of the pixels PX. The pixel electrode PE controls movement of the liquid crystals corresponding thereto, thereby controlling a transmission amount of light. The capacitor in each pixel PX may be turned-on/off independently of the capacitors of other pixels PX by the switching element Tr.

As illustrated in FIG. 2, an insulating layer IL may be disposed on the pixel electrode PE. The insulating layer IL protects the pixel electrode PE. The insulating layer IL may insulate the pixel electrode PE from the liquid crystals.

As illustrated in FIG. 1, the color filter substrate 200 is disposed to oppose the lower substrate 100. The color filter substrate 200 may include a plurality of light transmitting regions DA and a light shielding region SA disposed between the light transmitting regions DA. Regions of the color filter substrate 200 corresponding to the pixels PX of the lower substrate 100 are illustrated with intersecting lines. Each of the light transmitting regions DA may overlap with each of the pixel electrodes PE. The light shielding region SA may be arranged in a lattice-shape (or a mesh-shape). The light shielding region SA may overlap with the signal interconnections and the switching elements Tr.

The color filter substrate 200 will be described in more detail with reference to FIG. 2. As illustrated in FIG. 2, the color filter substrate 200 includes a base substrate 210, a color layer 220, a grain compensation layer 230, and a conductive layer 240. The base substrate 210 is exposed toward the outside of the display device DP, and the conductive layer 230 faces the lower substrate 100. Hereinafter, elements of the color filter substrate 300 will be described in a direction DR3 from the outside to the inside of the display device DP.

One surface of the base substrate 210 is exposed toward the outside of the display device DP. The base substrate 210 covers the display device DP. The base substrate 210 maintains a stack structure of the color filter substrate 200 and protects the display device DP from the external environment. The base substrate 210 may be transparent so that information (e.g., an image) realized by the display device DP can be transmitted through the base substrate 210 to a viewer. For example, the base substrate 210 may include at least one of a glass, a synthetic resin, and a ceramic material. The color layer 220 is disposed on another surface of the base substrate 210. The color layer 220 provides colors to light which is output from the inside of the display device DP. The color layer 220 includes color patterns CL and a light shielding layer BM.

As illustrated in FIGS. 1 and 2, the light shielding layer BM includes a plurality of openings. The light shielding layer BM may be a black matrix. The light shielding layer BM shields the light transmitted from the inside of the display device DP to form the light shielding region SA. The light shielding layer BM includes a material which is highly reflective. The light shielding layer BM may include a highly-reflective metal or a black resin material. For example, the light shielding layer BM may include any one of chrome, a double layer of chrome/chrome oxide, a carbon pigment, and graphite As illustrated in FIG. 2, the color filter CL is disposed in each of the openings. Thus, the color layer 220 includes at least one color filter CL in each pixel. The color filter CL and the light shielding layer BM may be disposed in the same plane to form the color layer 220. The color filters CL overlap with the openings, respectively. Additionally, even though not shown in the drawings, the color filters CL may respectively overlap with portions of the light shielding layer BP that are adjacent to the openings.

The color filters CL may include pigments having various colors, respectively. Colors expressed by the color filters CL are determined depending on the pigments. For example, the color filters CL may include a red color, a blue color, a green color, and a white color, respectively.

The color filters CL disposed in a plurality of openings adjacent to each other may include materials having different transmittances from each other. The various colors may be embodied depending on the transmittances. Thus, the color filters CL in the openings have different colors from each other. The color filters CL may correspond to the light transmitting regions DA. Thus, the light transmitting regions DA may express different colors from each other.

As a result, the light shielding layer BM may at least partially define the light transmitting regions DA. The light shielding layer BM prevents light leakage and color interference between colors expressed by the color filters CL, thereby improving color resolution of the display device DP.

The conductive layer 240 is disposed on the color layer 220. The conductive layer 240 may be a common electrode. The conductive layer 240 and the pixel electrode PE of the lower substrate 100 may constitute a capacitor on each pixel PX. The conductive layer 240 may be formed of a transparent conductive material. For example, the conductive layer 240 may be formed of at least one of indium-tin oxide, indium-zinc oxide, indium-gallium-zinc oxide, fluorine-zinc oxide, gallium-zinc oxide, and tin oxide.

The grain compensation layer 230 is disposed between the color layer 220 and the conductive layer 240. The grain compensation layer 230 may be formed of a transparent material having a high transmittance. Additionally, the grain compensation layer 230 is used as a seed layer for determining a grain size of the conductive layer 240. A grain size of the conductive layer 240 formed on the grain compensation layer 230 is greater than that of the conductive layer 240 formed on the color layer 220 without the grain compensation layer 230. The grain compensation layer 230 increases the grain size of the conductive layer 240. Thus, the grain compensation layer 230 may be a thin poly-crystalline layer having a high light transmittance. The grain compensation layer 230 includes a transparent poly-crystalline material. For example, the transparent poly-crystalline material may include zinc oxide (ZnO).

The grain compensation layer 230 includes zinc oxide as a base material and further includes a metal oxide different from zinc oxide. Because the grain compensation layer 230 includes a mixture of the zinc oxide and the metal oxide, the grain size of the conductive layer 240 disposed on the grain compensation layer 230 may be easily controlled.

The grain compensation layer 230 may include various amounts of the metal oxide. However, in the grain compensation layer, the content of the metal oxide is less than the content of the zinc oxide. For example, the grain compensation layer 230 may include the metal oxide of about 1 wt % to about 30 wt %. The metal oxide may be aluminum oxide ($Al_2O_3$) or gallium oxide ($Ga_2O_3$). Alternatively, the metal oxide may include both aluminum oxide ($Al_2O_3$) and gallium oxide ($Ga_2O_3$).

The grain compensation layer 230 may be formed of an aluminum-zinc oxide (AZO) thin layer including aluminum oxide ($Al_2O_3$). Alternatively, the grain compensation layer 230 may be formed of a gallium-zinc oxide (GZO) thin layer including gallium oxide ($Ga_2O_3$). Further still, the grain compensation layer 230 may be formed of a poly-crystalline thin layer including both aluminum oxide ($Al_2O_3$) and gallium oxide ($Ga_2O_3$).

The grain compensation layer 230 may be formed to have one of various thicknesses. For example, the grain compensation layer 230 may have a thickness in the range of about 50 Å to about 200 Å. If the grain compensation layer 230 is thicker than about 200 Å, a resistance of the grain compensation layer 230 may be too high. Thus, it is difficult to control the capacitance between the conductive layer 240 and the pixel electrode PE such that a power consumption of the display device DP may be increased. If the grain compensation layer 230 is less than about 50 Å, it may be difficult for the grain compensation layer 230 to act as the seed layer.

Referring to FIGS. 1 and 2, the liquid crystal layer 300 is disposed between the lower substrate 100 and the color filter substrate 200. The liquid crystal layer 300 may be sealed between the lower substrate 100, the color filter substrate 200, and a spacer (not shown) disposed between the lower substrate 100 and the color filter substrate 200.

The liquid crystal layer 300, the conductive layer 240, and the pixel electrode PE constitute the capacitor. The liquid crystal layer 300 has various arrangements determined by the electric field generated by a voltage difference between the conductive layer 240 and the pixel electrode PE. The liquid crystal layer 300 controls the transmission amount of the light transmitted through the lower substrate 100, according to the orientation of liquid crystals included therein.

The liquid crystal layer 300 has both fluidity and anisotropy. The liquid crystal layer 300 may include a twisted nematic liquid crystal, a smectic liquid crystal, a vertical alignment liquid crystal, a cholesteric liquid crystal, or a homogeneous alignment liquid crystal.

Even though not shown in the drawings, the display device DP may further include an alignment layer (not shown) disposed between the liquid crystal layer 300 and the color filter substrate 200. Additionally, the display device DP may further include an optic member (not shown) disposed on an outer side of the base substrate 210 of the color filter substrate 200.

Figure 3A:
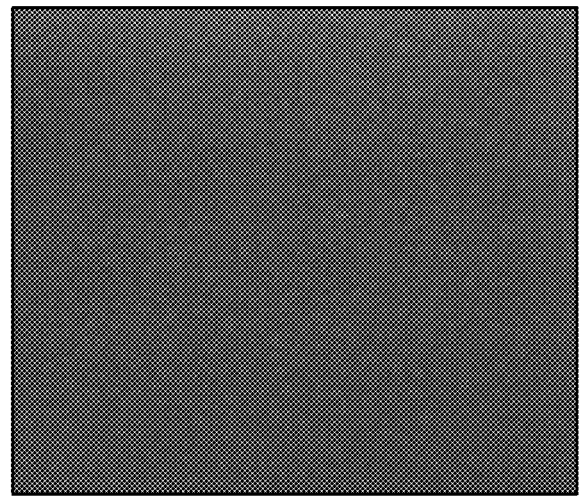
FIGS. 3A to 3C are scanning electron microscope (SEM) micrographs of indium-tin oxide thin layers respectively disposed on different layers from each other.
Figure 3B:
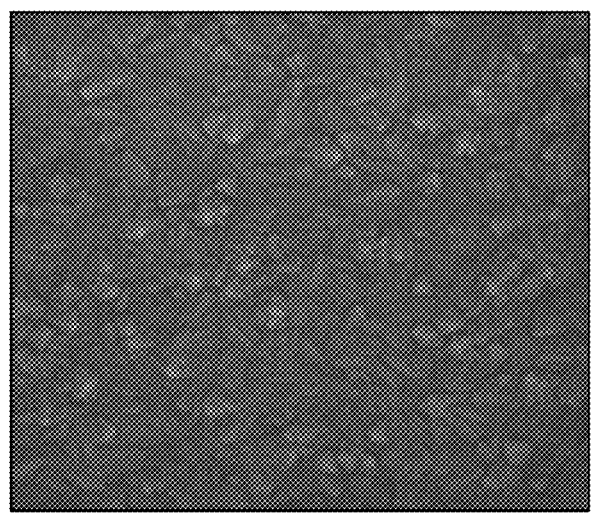
Figure 3C:
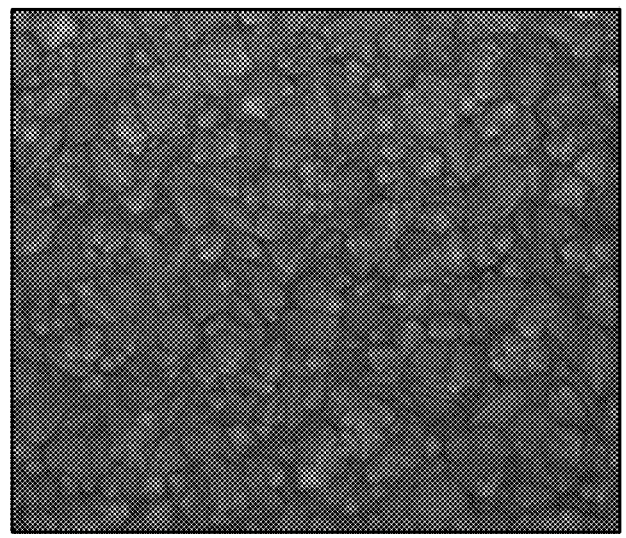

FIGS. 3A to 3C are scanning electron microscope (SEM) micrographs of indium-tin oxide thin layers respectively disposed on different layers. FIG. 3A illustrates a SEM photograph of an indium-tin oxide thin layer grown on an insulating layer. FIG. 3B illustrates a SEM photograph of an indium-tin oxide thin layer grown on a zinc oxide thin layer. FIG. 3C illustrates a SEM photograph of an indium-tin oxide thin layer grown on the grain compensation layer 230. The photographs of FIGS. 3A to 3C are images magnified by a factor of 150,000.

In FIG. 3B, the zinc oxide thin layer does not include other metal oxides. In FIG. 3C, the grain compensation layer 230 includes aluminum oxide ($Al_2O_3$). In FIG. 3C, the zinc oxide thin layer including 2 wt % aluminum oxide ($Al_2O_3$) was formed on an insulating layer. The influence of the grain compensation layer 230 on the grain size of the conductive layer 240 will be described with reference to FIGS. 3A to 3C.

Referring to FIGS. 3A and 3B, a grain size of the indium-tin oxide grown on the zinc oxide thin layer was minutely greater than a grain size of the indium-tin oxide grown on the insulating layer. This is because the zinc oxide thin layer has a basically poly-crystalline structure. Alternatively, the insulating layer is formed of a polymer resin layer. Thus, the insulating layer may be amorphous.

Referring to FIGS. 3A to 3C, the grain size of the indium-tin oxide thin layer on the grain compensation layer 230 is the greatest. Due to the presence of the grain compensation layer 230, the grain size of the conductive layer 240 is remarkably increased. Because the grain compensation layer 230 includes the metal oxide added into the zinc oxide thin layer, its seed layer function may be improved.

The zinc oxide thin layer may be generally used as a buffer layer. The grain compensation layer 230 has an adhesive strength similar to that of the zinc oxide thin layer. However, the influence of the grain compensation layer 230 on the grain size of the conductive layer 240 is greater than the influence of the zinc oxide thin layer on the grain size of the conductive layer 240.

Generally, if a grain size of a material is increased, a number of grains in the unit area is decreased. Therefore total contact areas of the grains may be reduced. And a grain boundary may be reduced. The grain boundary between the grains may be a path through which moisture can permeate. As the grain size is increased, the path through which the moisture permeates may be reduced.

The moisture permeated into a display device may cause a stain. The stain may mainly occur in a border portion of the display device that is in contact with an external environment. Thus, the grain size of the conductive layer 240 is controlled to prevent the border stain from occurring.

Figure 4:
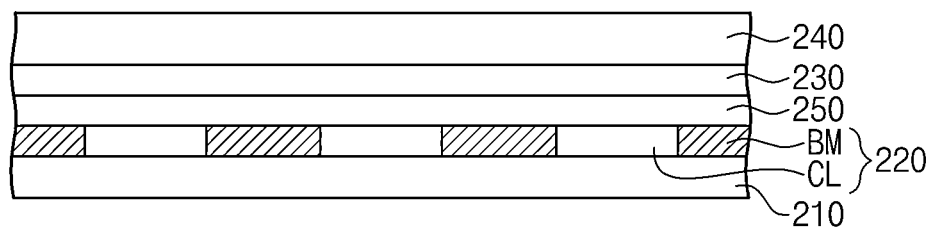
FIG. 4 is a cross-sectional view illustrating a color filter substrate according to an exemplary embodiment of the present invention.

FIG. 4 is a cross-sectional view illustrating a color filter substrate according to an exemplary embodiment. In the present exemplary embodiment, the same elements as illustrated in FIGS. 1, 2, and 3A to 3C will be indicated by the same reference numerals or the same reference designators. The descriptions for the same elements as illustrated in FIGS. 1, 2, and 3A to 3C will be omitted.

The color filter substrate 200 may further include an insulating layer 250. The insulating layer 250 is disposed between the color layer 220 and the grain compensation layer 230. The insulating layer 250 may be, for example, an overcoat layer. The insulating layer 250 may protect the color layer 220 and may planarize a top surface of the color layer 220.

The insulating layer 250 maybe transparent so that light outputted from the inside of the display device DP is shown to users. The insulating layer 250 may include polyimide, polyacrylate, polyacrylamide, polyurethane, and/or polyvinylacrylate.

The insulating layer 250 may planarize both the color layer 220 and the grain compensation layer 230. Thus, because the display device DP further includes the insulating layer 250, a thickness of the grain compensation layer 230 may be easily controlled. Additionally, the grains of the conductive layer 240 may be uniformly formed.

Figure 5:
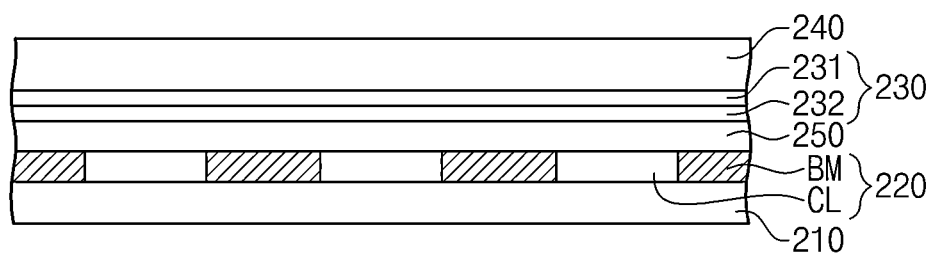
FIG. 5 is a cross-sectional view illustrating a color filter substrate according to another exemplary embodiment of the present invention.

FIG. 5 is a cross-sectional view illustrating a color filter substrate according another exemplary embodiment. In this exemplary embodiment, the same elements as described with reference to FIGS. 1 to 4 will be indicated by the same reference numerals or the same reference designators. The descriptions for the same elements as illustrated in FIGS. 1 to 4 will be omitted.

As illustrated in FIG. 5, the grain compensation layer 230 may include a first grain compensation layer 231 and a second grain compensation layer 232. The first grain compensation layer 231 includes zinc oxide and a first metal oxide different from zinc oxide. The second grain compensation layer 232 includes zinc oxide and a second metal oxide different from zinc oxide.

The first metal oxide may be different from the second metal oxide. Alternatively, the grain compensation layer 230 may have a stack structure including a plurality of layers having the same composition.

FIGS. 6A to 6G are cross-sectional views illustrating a method of fabricating a color filter substrate according to an exemplary embodiment. Meanwhile, the array substrate including driving elements is bonded to the color filter substrate, and then the liquid grain layer is injected into a space between the array substrate and the color filter substrate to form a display device according to an exemplary embodiment.

The driving elements and a plurality of signal interconnections providing electrical signals to the driving elements are formed on a substrate, thereby forming the array substrate. For example, the array substrate may be formed through a deposition process, an exposure process, a development process, and etching process, et cetera. Hereinafter, a method of fabricating the color filter substrate in a method of fabricating the display device will be described with reference to FIGS. 6A to 6G.

The method of fabricating the color filter substrate includes forming a color layer on a substrate, forming an overcoat layer, forming a grain compensation layer, and forming a conductive layer.

Figure 6A:
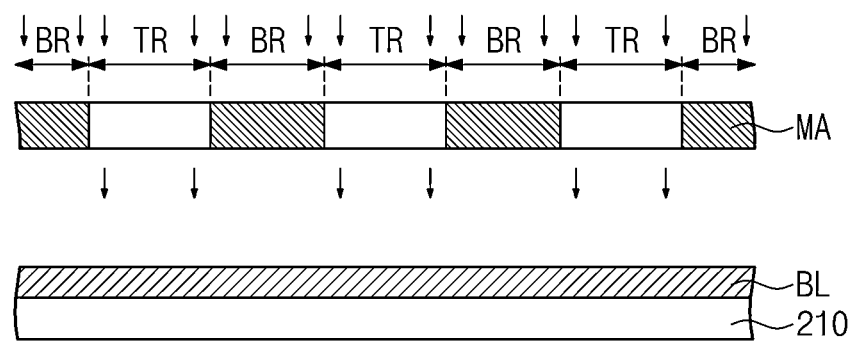
FIGS. 6A to 6G are cross-sectional views illustrating a method of fabricating a color filter substrate according an exemplary embodiment of the present invention.

As illustrated in FIG. 6A, a light shielding material BL is coated on a substrate 210. The light shielding material BL may be formed of a photosensitive resin containing a black pigment. The black pigment may be, for example, a carbon black. A mask MA is disposed on the light shielding material BL coated on the substrate 210. The mask MA includes a plurality of light shielding parts BR and a plurality of transmitting parts TR. If light is irradiated to the mask MA, only the light through the transmitting parts TR reaches the light shielding material BL. A mask MA is disposed on the light shielding material BL coated on the substrate 210. The mask MA includes a plurality of light shielding parts BR and a plurality of transmitting parts TR. If light is irradiated to the mask MA, only the light through the transmitting parts TR reaches the light shielding material BL.

Figure 6B:
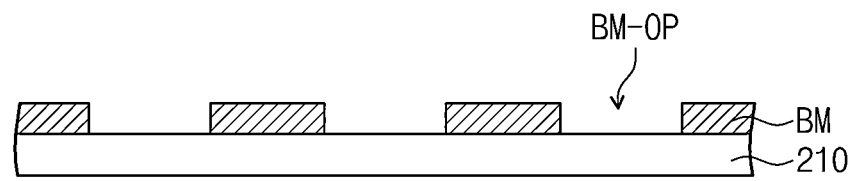

As illustrated in FIG. 6B, the photolithography process is performed to form a light shielding layer BM having a plurality of openings BM-OP. If the light shielding material BL includes a positive photoresist, the openings BM-OP are formed at regions corresponding to the transmitting parts TR. Alternatively, if the light shielding material BL includes a negative photoresist, the plurality of openings BM-OP may be formed at regions corresponding to the light shielding parts BR even though not shown in the drawings.

Figure 6C:
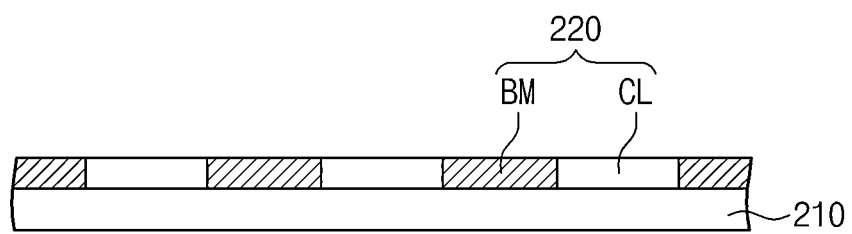

As illustrated in FIG. 6C, color filters CL are formed in the openings BM-OP, thereby forming the color layer 220. For example, the color filers CL having pre-selected colors may be formed in the openings BM-OP by a printing method. The color filters CL may sequentially fill the plurality of the openings BM-OP.

Even though not shown in the drawings, the color filters CL may be formed by various methods except a printing method. For example, the color filters CL may be formed using a process selected from a group consisting of a dyeing method, an electro-deposition method, and a pigment dispersion method. However, if a dyeing method or a electro-deposition method is used, the color filters CL may be formed before the light shielding layer BM is formed.

Figure 6D:
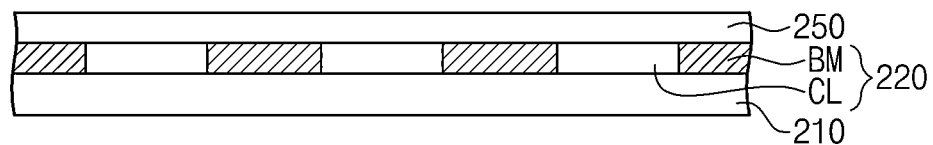

As illustrated in FIG. 6D, an insulating layer 250 is coated on the color layer 220. The insulating layer 250 may protect the color layer 220 and may be an overcoat layer for planarizing a top surface of the color layer 220.

Figure 6E:
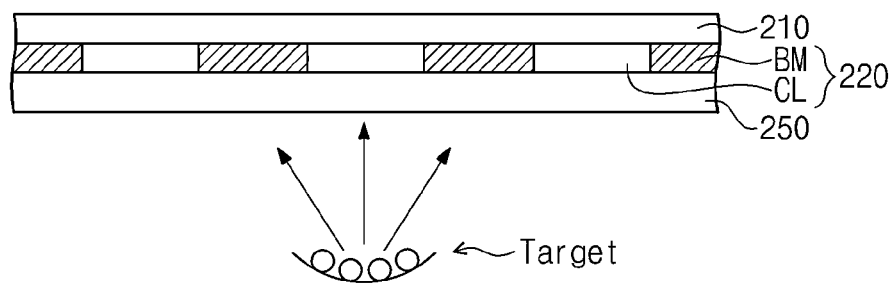
Figure 6F:
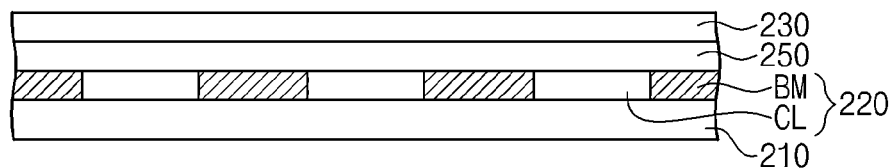

A process of forming the grain compensation layer 230 is illustrated in FIGS. 6E and 6F. The grain compensation layer 230 may be formed using a sputtering method, but the present invention is not limited thereto. In other exemplary embodiments, the grain compensation layer 230 may be formed by various thin layer deposition methods.

Referring to FIG. 6E, a thin layer is deposited using a deposition source on the insulating layer 250. A target used as the deposition source is a mixture of zinc oxide and a metal oxide different from zinc oxide. The target may include at least one of aluminum oxide ($Al_2O_3$) and gallium oxide ($Ga_2O_3$) as the metal oxide. The zinc oxide and the metal oxide are sintered to form the target.

In a vacuum chamber, ionized argon gases are accelerated to form particles of the target. The target particles are deposited on the insulating layer 250. As illustrated in FIG. 6F, the crystal compensation layer 230 is formed on the insulating layer 250. The grain compensation layer 230 may be an AZO thin layer including aluminum oxide ($Al_2O_3$) used as the metal oxide. Alternatively, the grain compensation layer 230 may be a GZO thin layer including gallium oxide ($Ga_2O_3$) as the metal oxide.

Figure 6G:
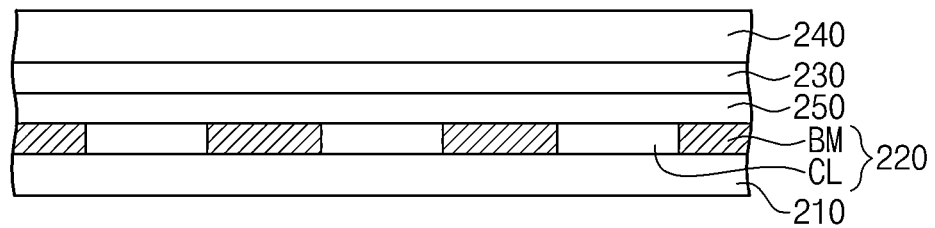

As illustrated in FIG. 6G, the conductive layer 240 is formed on the grain compensation layer 230. The conductive layer 240 is formed using a transparent conductive material. For example, the conductive layer 240 is formed using indium-tin oxide, indium-zinc oxide, indium-gallium-zinc oxide, fluorine-zinc oxide, gallium-zinc oxide, and/or tin oxide.

The conductive layer 240 may be formed through various deposition methods such as a physical vapor deposition method, a chemical vapor deposition method, a plasma vapor deposition method, and/or an electron beam deposition method. For example, the conductive layer 240 may be formed by a sputtering method using the transparent conductive material as a target.

If the conductive layer 240 is formed on the grain compensation layer 230, the conductive layer 240 has a first grain size. If the conductive layer 240 is formed on the insulating layer 250, the conductive layer 240 has a second grain size. The first grain size is greater than the second grain size. In other words, the grain size of the conductive layer 240 may be increased by the grain compensation layer 230. The insulating layer 250 has a smoother surface characteristic than the grain compensation layer 230, and this characteristic may be one of main reasons for making different grain sizes for the conductive layer 240. The grain compensation layer 230 may control the surface characteristic of the conductive layer 240.

The grain compensation layer 230 is the poly-crystalline thin layer and acts as the seed layer of the conductive layer 240. The conductive layer 240 formed on the grain compensation layer 230 has the grain size increased by the compensation layer 230.

The conductive layer 240 having the increased grain size may inhibit external moisture from permeating into the display device. Thus, stains on the border of the display device may be prevented.

As described above, the color filter substrate according to exemplary embodiments of the present invention includes the grain compensation layer to increase the grain size of the conductive layer. Thus, the moisture permeated into the conductive layer may be blocked. Additionally, the method of fabricating the color filter substrate provides the color filter substrate including the grain compensation layer.

Moreover, the display device according to exemplary embodiments of the present invention includes a color filter substrate in which a border stain of the display device may be prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A color filter substrate, comprising:
   a base substrate;
   a color layer disposed on the base substrate;
   a conductive layer disposed on the color layer, the conductive layer comprising a plurality of grains; and
   a grain compensation layer independent from the conductive layer, disposed between the color layer and the conductive layer, and configured to control a grain size of the conductive layer, the grain compensation layer comprising zinc oxide (ZnO) and a first metal oxide different from zinc oxide,
wherein:
the grain compensation layer comprises a lower content of the first metal oxide than a content of the zinc oxide;
the grain compensation layer is in contact with the conductive layer so as to form a boundary between the grain compensation layer and the conductive layer;
the grain compensation layer is configured to control the grain size of the conductive layer; and
the first metal oxide comprises oxide ($Ga_2O_3$) or a combination of aluminum oxide ($Al_2O_3$) and gallium oxide.

2. The color filter substrate of claim 1, wherein the grain compensation layer comprises about 1wt% to about 30wt% of the first metal oxide, with respect to a total weight of the grain compensation layer.

3. The color filter substrate of claim 1, wherein the grain compensation layer has a thickness in a range of about 50Å to about 200Å.

4. The color filter substrate of claim 1, further comprising an insulating layer disposed between the color layer and the grain compensation layer, the insulating layer planarizing the color layer.

5. The color filter substrate of claim 1, wherein the color layer comprises:
a light shielding layer comprising openings; and
color filters disposed in the openings.

6. The color filter substrate of claim 1, wherein:
the grain compensation layer comprises a first grain compensation layer and a second grain compensation layer; and
wherein the first grain compensation layer includes zinc oxide and the first metal oxide; and
the second grain compensation layer includes zinc oxide and a second metal oxide different from zinc oxide.

7. A display device, comprising:
a color filter substrate;
an array substrate facing the color filter substrate and comprising driving elements; and
a liquid crystal layer disposed between the color filter substrate and the array substrate, wherein the color filter substrate comprises:
a base substrate;
a color layer disposed on the base substrate;
an insulating layer disposed on the color layer;
a conductive layer disposed on the insulating layer, the conductive layer comprising a plurality of grains; and
a grain compensation layer independent from the conductive layer, disposed between the insulating layer and the conductive layer, and configured to control a grain size of the conductive layer, the grain compensation layer comprising zinc oxide (ZnO) and a first metal oxide different from zinc oxide,
wherein:
the grain compensation layer comprises a lower content of the first metal oxide than a content of the zinc oxide;
the grain compensation layer is poly-crystalline
the grain compensation layer is in contact with the conductive layer so as to control the grain compensation layer; and
the first metal oxide comprises gallium oxide ($Ga_2O_3$) or a combination of aluminum oxide ($Al_2O_3$) and gallium oxide.

8. The display device of claim 7, wherein the grain compensation layer comprises about 1wt% to about 30wt% of the first metal oxide, with respect to a total weight of the grain compensation layer.

9. The display device of claim 7, wherein the grain compensation layer has a thickness in a range of about 50Å to about 200Å.

10. The display device of claim 7, wherein the color layer comprises:
a color filter; and
a black matrix surrounding the color filter.

11. The display device of claim 7, wherein:
the grain compensation layer comprises a first grain compensation layer and a second grain compensation layer;
the first grain compensation layer comprises zinc oxide and the first metal oxide; and
the second grain compensation layer comprises zinc oxide and a second metal oxide different from zinc oxide.

12. A method of fabricating a color filter substrate, the method comprising:
forming a color layer on a base substrate;
forming a grain compensation layer on the color layer; and
forming a conductive layer directly on the grain compensation layer, the conductive layer comprising a plurality of grains,
wherein the grain compensation layer comprises zinc oxide (ZnO) and a first metal oxide different from zinc oxide;
the grain compensation layer is configured to increase a grain size of the conductive layer and comprises a lower content of the first metal oxide than a content of the zinc oxide; and
the first metal oxide comprises gallium oxide ($Ga_2O_3$) or a combination of aluminum oxide ($al_2O_3$) and gallium oxide.

13. The method of claim 12, wherein forming the color layer comprises:
forming a light shielding layer on the base substrate, the light shielding layer comprising openings exposing portions of the base substrate; and
forming color filters in the openings of the light shielding layer.

14. The method of claim 12, further comprising:
forming an insulating material to planarize the color layer after forming the color layer and before forming the grain compensation layer.

15. The method of claim 12, wherein the grain compensation layer is formed by a sputtering process.

16. The method of claim 12, wherein the conductive layer is formed using a deposition process.

17. A method of fabricating a display device, the method comprising:
forming a color filter substrate on an array substrate;
bonding the color filter substrate to the array substrate; and
injecting a liquid crystal between the color filter substrate and the array substrate to form a liquid crystal layer,
wherein forming a color filter substrate comprises:
forming a color layer comprising at least one color filter and a black matrix adjacent to the at least one color filter on a base substrate;
forming a grain compensation layer on the color layer; and forming a conductive layer directly on the grain compensation layer, the conductive layer comprising a plurality of grains, wherein:

the grain compensation layer comprises zinc oxide (ZnO) and a first metal oxide different from zinc oxide;

the grain compensation layer is configured to control a grain size of the conductive layer and comprises a lower content of the first metal oxide than a content of the zinc oxide;

the grain compensation layer is poly-crystalline; and the first metal oxide comprises gallium oxide ($Ga_2O_3$) or a combination of aluminum oxide ($Al_2O_3$) and gallium oxide.

18. The method of claim 17, further comprising:

forming an insulating material to planarize the color layer after forming the color layer and before forming the grain compensation layer.

19. The method of claim 17, wherein the grain compensation layer is formed by a sputtering process.

20. The method of claim 19, wherein the conductive layer is formed using a deposition process.

* * * * *